(12) United States Patent
Tanaka (10) Patent No.: US 12,126,345 B2
(45) Date of Patent: Oct. 22, 2024

(54) CLOCK ENABLER CIRCUIT

(71) Applicant: SONY SEMICONDUCTOR SOLUTIONS CORPORATION, Kanagawa (JP)

(72) Inventor: Yoshinori Tanaka, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 92 days.

(21) Appl. No.: 17/759,174

(22) PCT Filed: Oct. 27, 2020

(86) PCT No.: PCT/JP2020/040269
§ 371 (c)(1),
(2) Date: Jul. 20, 2022

(87) PCT Pub. No.: WO2021/152938
PCT Pub. Date: Aug. 5, 2021

(65) Prior Publication Data
US 2023/0043523 A1      Feb. 9, 2023

(30) Foreign Application Priority Data
Jan. 29, 2020   (JP) ................................ 2020-012092

(51) Int. Cl.
*H03K 5/15*     (2006.01)
*H03K 5/131*    (2014.01)
*H03K 19/096*   (2006.01)

(52) U.S. Cl.
CPC ......... *H03K 5/15006* (2013.01); *H03K 5/131* (2013.01); *H03K 19/096* (2013.01)

(58) Field of Classification Search
CPC .. H03K 5/15006; H03K 5/131; H03K 19/096; H03K 3/037; H03K 3/356; H03K 5/15; Y02D 10/00; G06F 1/04
See application file for complete search history.

(56) References Cited

U.S. PATENT DOCUMENTS 6,456,115 B2      9/2002  Li et al.
2007/0285147 A1*  12/2007 Sakai ................... H03K 5/1565
                                                   327/333

(Continued)

FOREIGN PATENT DOCUMENTS

JP   2007-042991 A   2/2007
JP   2008-085519 A   4/2008

(Continued)

OTHER PUBLICATIONS

Optimized Clock Gating Structure, IP.com Prior Art Database Technical Disclosure IPCOM000189574D, Nov. 13, 2009 (Year: 2009).*

(Continued)

*Primary Examiner* — Daniel R Miller
(74) *Attorney, Agent, or Firm* — CHIP LAW GROUP (57) ABSTRACT

An unnecessary circuit operation in a clock enabler circuit accompanying toggling of a clock signal is suppressed. A state holding unit performs a holding operation of a state as to whether or not to output an output clock signal according to an internal clock signal. A clock signal output unit controls output of the output clock signal according to the state held in the state holding unit. A control unit supplies, to the state holding unit, the internal clock signal and a value of the state that are necessary for the holding operation in the state holding unit on a basis of a clock signal and a clock enable signal from an outside.

10 Claims, 12 Drawing Sheets

(56) References Cited

U.S. PATENT DOCUMENTS

| | | | | |
|---|---|---|---|---|
| 2010/0109747 | A1* | 5/2010 | Datta | H03K 3/356086 |
| | | | | 327/379 |
| 2014/0070847 | A1* | 3/2014 | Elkin | H03K 19/0016 |
| | | | | 326/98 |
| 2014/0184271 | A1* | 7/2014 | Gurumurthy | H03K 19/0016 |
| | | | | 326/93 |
| 2015/0162910 | A1* | 6/2015 | Liu | H03K 3/033 |
| | | | | 326/98 |
| 2016/0211846 | A1* | 7/2016 | Rasouli | H03K 17/6872 |
| 2021/0064076 | A1* | 3/2021 | Shamanna | H03K 19/0016 |
| 2021/0135659 | A1* | 5/2021 | Lee | G06F 1/08 |

FOREIGN PATENT DOCUMENTS

| | | |
|---|---|---|
| JP | 2010-045483 A | 2/2010 |
| JP | 2010-124059 A | 6/2010 |
| JP | 2015-535401 A | 12/2015 |
| WO | 2018/230338 A1 | 12/2018 |

OTHER PUBLICATIONS

T. Chindhu S. and N. Shanmugasundaram, "Clock Gating Techniques: An Overview," 2018 Conference on Emerging Devices and Smart Systems (ICEDSS), Tiruchengode, India, 2018, pp. 217-221 (Year: 2018).*

International Search Report and Written Opinion of PCT Application No. PCT/JP2020/040269, issued on Dec. 1, 2020, 09 pages of ISRWO.

* cited by examiner

| STATE | | S | R | Q | QB | LATCH | NOTE |
|---|---|---|---|---|---|---|---|
| | CK STATE, LATCH | ETNR | CK | LE | CKB | LATCH | |
| #1 | L BLOCK, LAT | 1 | 0 | 0 | 1 | 0 | |
| #2 | H BLOCK, LAT | 1 | 1 | 0 | 1 | 0 | → S=1, R=0 |
| #3 | H BLOCK, LATB | 0 | 1 | 1 | 0 | KEEP 1 | |
| #4 | H BLOCK 2, LAT | 0 | 1 | 1 | 0 | KEEP 0 | DELAY NEEDED |
| #5 | CK H KEEP, LATB | 1 | 1 | 1 | 0 | KEEP 1 | → S=0, R=1 |
| #6 | H BLOCK 3, LAT | 1 | 1 | 1 | 0 | KEEP 0 | → S=0, R=1 |
| #7 | L PASS, LATB | 0 | 0 | 1 | 1 | 1 | |

CLOCK ENABLER CIRCUIT

CROSS REFERENCE TO RELATED APPLICATIONS

This application is a U.S. National Phase of International Patent Application No. PCT/JP2020/040269 filed on Oct. 27, 2020, which claims priority benefit of Japanese Patent Application No. JP 2020-012092 filed in the Japan Patent Office on Jan. 29, 2020. Each of the above-referenced applications is hereby incorporated herein by reference in its entirety.

TECHNICAL FIELD

The present technology relates to a clock enabler circuit. Specifically, the present technology relates to a clock enabler circuit that controls transmission of a clock signal.

BACKGROUND ART

A clock enabler circuit (also referred to as a clock gating cell) is a circuit that outputs a clock signal when a clock enable signal indicates an enable state. This clock enabler circuit is often used to reduce power consumption of a semiconductor integrated circuit by avoiding unnecessary operation by a clock signal. As a clock enabler circuit, for example, a circuit that fetches an asynchronous clock enable signal into an internal latch in synchronization with a clock signal is known as a conventional technology (see, for example, Patent Document 1).

CITATION LIST

Patent Document

Patent Document 1: Japanese Patent Application Laid-Open No. 2010-124059

SUMMARY OF THE INVENTION

Problems to be Solved by the Invention

In the conventional technology described above, synchronization with the clock signal is achieved by fetching the clock enable signal into the latch during a period in which the clock signal is at the L level. However, in the conventional technology, an internal circuit operates every time the clock signal toggles regardless of the value of the clock enable signal and consumes power, which is disadvantageous.

The present technology has been made in view of such a situation, and an object thereof is to suppress an unnecessary circuit operation accompanying toggling of a clock signal in a clock enabler circuit.

Solutions to Problems

The present technology has been made to overcome the above-described disadvantage, and a first aspect thereof is a clock enabler circuit including a state holding unit that performs a holding operation of a state as to whether or not to output an output clock signal according to an internal clock signal, a clock signal output unit that controls output of the output clock signal according to the state held in the state holding unit, and a control unit that supplies, to the state holding unit, the internal clock signal and a value of the state that are necessary for the holding operation on the basis of a clock signal and a clock enable signal from an outside. This provides an effect of stopping the toggling of the internal clock signal unnecessary for the holding operation of the state as to whether or not to output the output clock signal.

Furthermore, in the first aspect, the control unit may operate the internal clock signal when the clock enable signal indicates an enable state, and stop the internal clock signal when the clock enable signal does not indicate an enable state. This provides an effect of stopping toggling of the internal clock signal according to the state of the clock enable signal.

Furthermore, in the first aspect, the control unit may supply a state to output the output clock signal as the value of the state in a case where the clock enable signal indicates an enable state, and supply a state of not to output the output clock signal as the value of the state in a case where the clock enable signal does not indicate an enable state. This provides an effect of supplying the value of the state held in the state holding unit according to the clock enable signal.

Furthermore, in the first aspect, the state holding unit may include a delay unit that delays a timing when the value of the state is held. This provides an effect of preventing a malfunction by adjusting the timing when the state holding unit is caused to hold the value. In this case, the delay unit may be a clocked inverter that operates according to the internal clock signal, or may be a transmission gate that operates according to the internal clock signal.

Furthermore, in the first aspect, the clock signal output unit may generate the output clock signal on the basis of the clock signal from the outside. On the other hand, the clock signal output unit may generate the output clock signal on the basis of the internal clock signal. This provides an effect of separating the clock signal, which is from the outside, from the clock signal output unit and reducing the load capacitance of the clock signal from the outside.

Furthermore, in the first aspect, the control unit may include a reception circuit that receives the clock signal from the outside. This provides an effect of making the reception processing of the clock signal from the outside independent. In this case, the reception circuit may be a small-amplitude signal reception circuit or a differential small-amplitude signal reception circuit. This provides an effect of performing processing such as level conversion in one place.

MODE FOR CARRYING OUT THE INVENTION

Hereinafter, an aspect for carrying out the present technology (hereinafter, referred to as an embodiment) will be described. The description will be given in the following order.

1. Embodiment
2. Modifications

1. EMBODIMENT

[Semiconductor Integrated Circuit]

Figure 1:
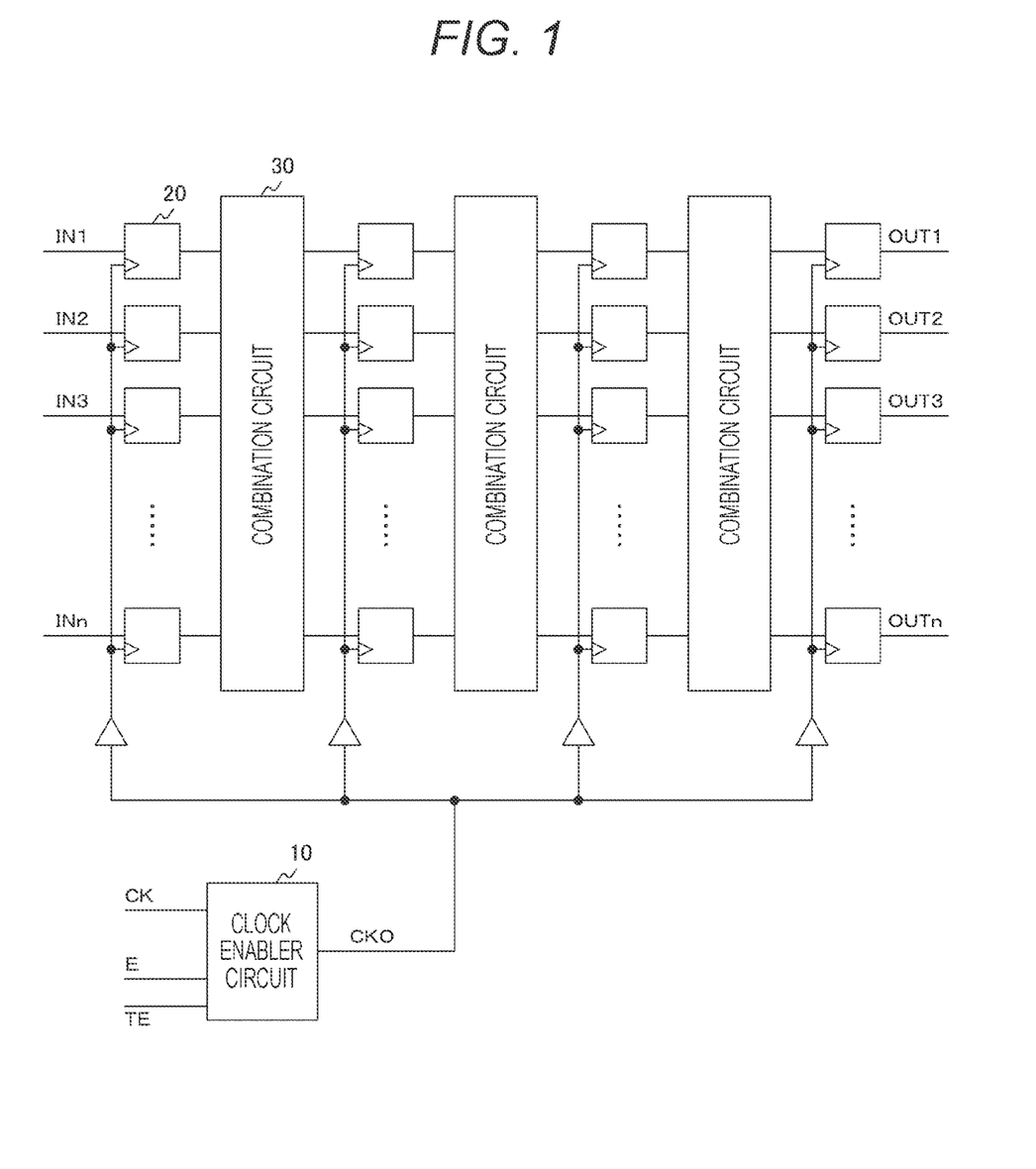
FIG. 1 is a diagram illustrating an example of a connection relationship between a clock enabler circuit 10 and a flip-flop circuit 20 according to an embodiment of the present technology.

FIG. 1 is a diagram illustrating an example of a connection relationship between a clock enabler circuit 10 and a flip-flop circuit 20 according to an embodiment of the present technology.

In the semiconductor integrated circuit, pipeline control is performed in order to speed up the operation. A combination circuit 30 is arranged at each stage of the pipeline, and a plurality of flip-flop circuits 20 is arranged in parallel at an input stage and an output stage thereof.

A clock signal CKO from the clock enabler circuit 10 is supplied to each of the flip-flop circuits 20. Therefore, each of the flip-flop circuits 20 at the first stage latches the input signals IN1 to INn in synchronization with the clock signal CKO and outputs the input signals IN1 to INn to the combination circuit 30 at the first stage. The output of the combination circuit 30 is latched in synchronization with the clock signal CKO by each of the flip-flop circuits 20 at the next stage. Then, each of the flip-flop circuits 20 at the last stage latches the output of the combination circuit 30 at the preceding stage in synchronization with the clock signal CKO, and the flip-flop circuits 20 output the latched output as output signals OUT1 to OUTn.

The clock enabler circuit 10 receives, as inputs a clock signal CK, an enable signal E, and a test signal TE from the outside, and outputs a clock signal CKO to be supplied to the flip-flop circuits 20. The enable signal E is a signal for enabling output of the clock signal CKO in the system mode. The test signal TE is a signal for performing a forced operation in the test mode. Since the enable signal E and the test signal TE are treated equally in the clock enabler circuit 10, the enable signal E and the test signal TE may be collectively referred to as a "clock enable signal" below.

[Clock Enabler Circuit]

Figure 2:
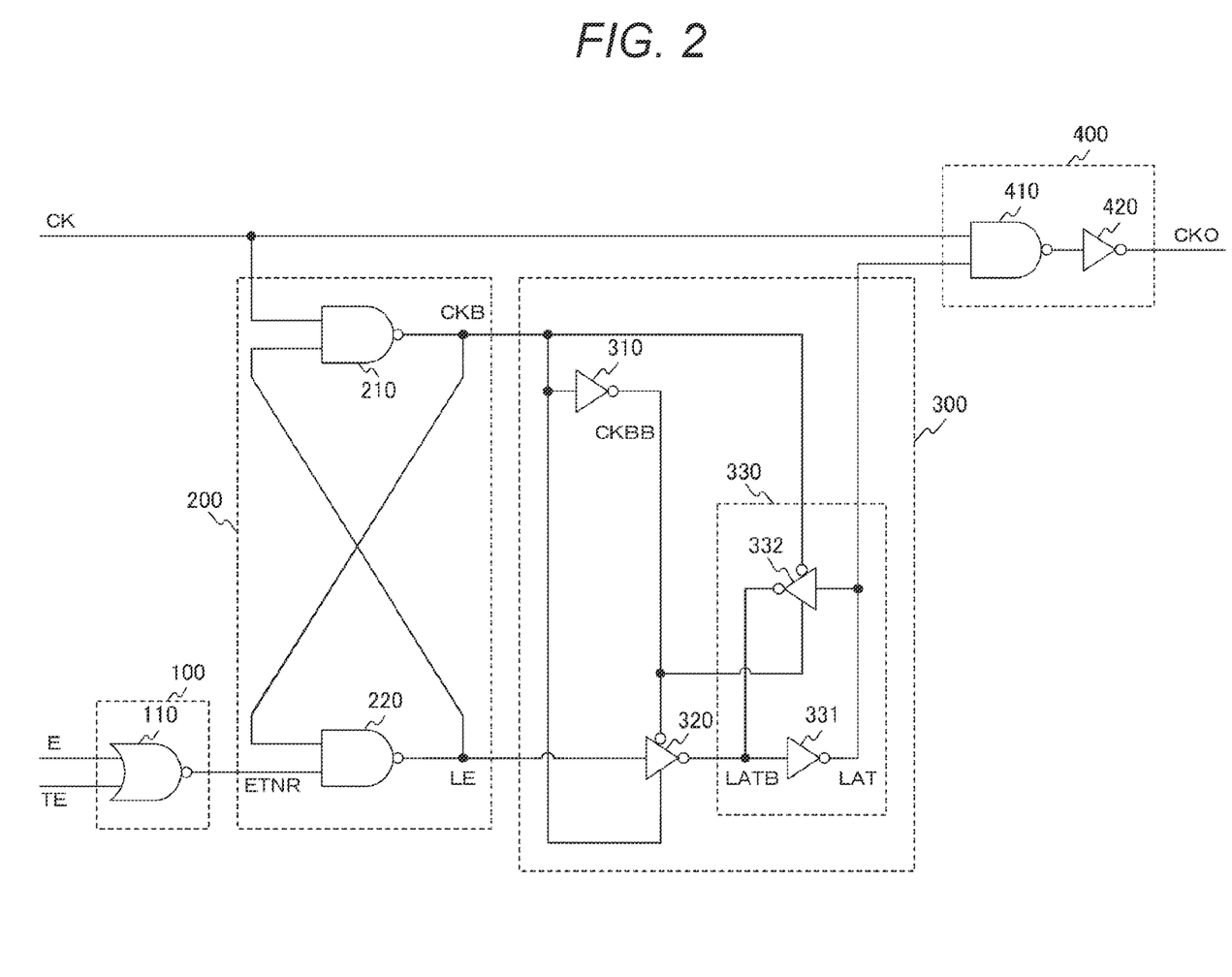
FIG. 2 is a diagram illustrating a configuration example of the clock enabler circuit 10 according to the embodiment of the present technology.

FIG. 2 is a diagram illustrating a configuration example of the clock enabler circuit 10 according to the embodiment of the present technology.

The clock enabler circuit 10 includes a clock enable signal generation unit 100, a control unit 200, a state holding unit 300, and a clock signal output unit 400.

The clock enable signal generation unit 100 is configured to generate a clock enable signal upon detection that at least one of the enable signal E or the test signal TE indicates an enable state. In consideration of ease of logic assembly at the subsequent stage in the control units 200, the negative logic is adopted. Therefore, the clock enable signal generation unit 100 includes a negative OR (NOR) gate 110. Therefore, an output ETNR of the clock enable signal generation unit 100 becomes the low (L) level in a case where at least one of the enable signal E or the test signal TE indicates the enable state, and becomes the high (H) level in a case where none of the enable signal E and the test signal TE indicates the enable state. Note that the number of test signal TE is not limited to one, and a plurality of the test signals TE may be provided.

The control unit 200 supplies an internal clock CKB and a value of a state LE that are necessary for the holding operation in the state holding unit 300 to the state holding unit 300 on the basis of the clock signal CK and the clock enable signal (negative logic thereof) ETNR from the outside. Therefore, the control unit 200 performs control to reduce the number of circuits operating in conjunction with the toggling of the clock signal CK when both the enable signal E and the test signal TE are at the L level. The control unit 200 includes an RS latch circuit including two negative AND (NAND) gates 210 and 220 to which a clock signal CK and ETNR are input. Therefore, the control unit 200 does not need the output signal of the state holding unit 300 as an input.

In the control unit 200, when LE is at the H level, the internal clock CKB that is an inverted signal of the clock signal CK is propagated through the negative AND gate 210 to the state holding unit 300 in the subsequent stage. On the other hand, when LE is at the L level, the clock signal CK is blocked by the negative AND gate 210, and the internal clock CKB is fixed at the H level.

Since the structure using an RS latch circuit is adopted for the control unit 200 as described above, the control unit 200 operates correctly even if the enable signal E or the test signal TE changes when the clock signal CK is at the H level. For example, in a case where the negative AND gate 220 is a simple inverter that inverts ETNR, when the enable signal E or the test signal TE changes while the clock signal CK is at the H level, the clock signal CKO changes at the timing when the enable signal E or the test signal TE changes. Therefore, a malfunction may occur. On the other hand, in this embodiment, by appropriately generating LE, the toggling of the internal clock CKB can be stopped when both the enable signal E and the test signal TE are at the L level, that is, when the clock signal CK does not need to be propagated to the clock signal CKO.

The state holding unit 300 performs a holding operation of a state as to whether or not to output the clock signal CK as the clock signal CKO according to the internal clock CKB. The state holding unit 300 functions as a low active latch using the internal clock CKB and LE as inputs, and includes a latch 330, an input buffer 320, and an inverted clock generation unit 310.

The latch 330 holds a state as to whether or not to output the clock signal CK as the clock signal CKO, and outputs a value of the state LAT that the latch 330 holds to the clock signal output unit 400. The latch 330 includes an inverter 331 and a clocked inverter 332, and holds a value in a loop connecting them. The clocked inverter 332 is controlled by the internal clock CKB and an inverted clock CKBB of the internal clock CKB.

The input buffer 320 is a buffer for writing a value to the latch 330, and is a clocked inverter controlled by the internal clock CKB and the inverted clock CKBB of the internal clock CKB.

The inverted clock generation unit 310 generates the inverted clock CKBB from the internal clock CKB. The internal clock CKB input to the inverted clock generation unit 310 and the inverted clock CKBB output from the inverted clock generation unit 310 are both supplied to the input buffer 320 and the clocked inverter 332.

Therefore, LE is written to LATB in the latch 330 when the internal clock CKB is at the H level.

The clock signal output unit 400 controls the output of the clock signal CKO according to the state held in the state holding unit 300. The clock signal output unit 400 performs, according to the output LAT of the latch 330, an operation to allow propagation of the clock signal CK to the output, or to block the clock signal CK when the output LAT is at the L level. The clock signal output unit 400 includes a negative AND (NAND) gate 410 and an inverter 420, and generates an AND of the clock signal CK and the output LAT of the latch 330 to generate the clock signal CKO as a whole.

[Operation]

Figure 3:
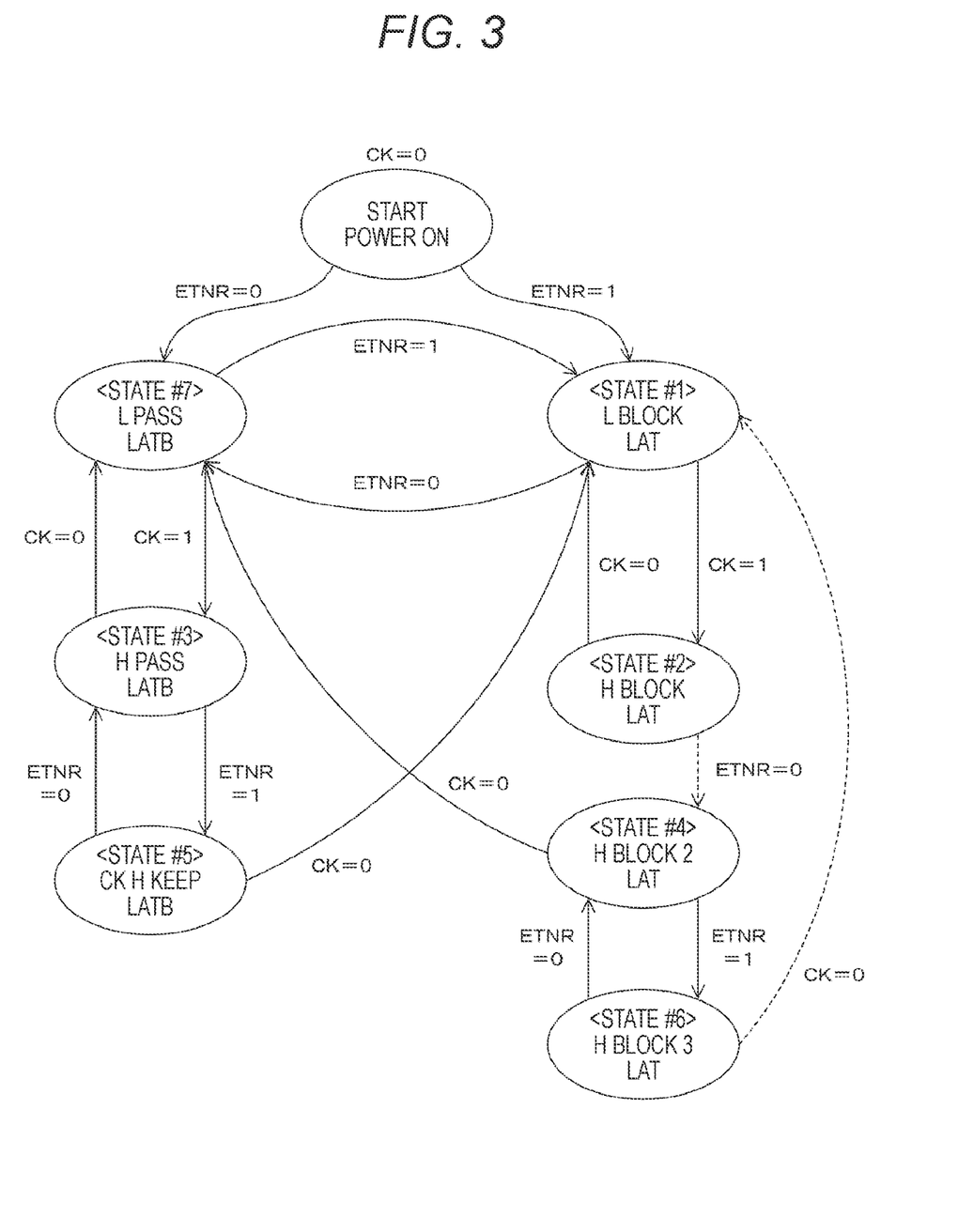
FIG. 3 is a diagram illustrating an example of state transition of a control unit 200 according to the embodiment of the present technology.
Figure 4:
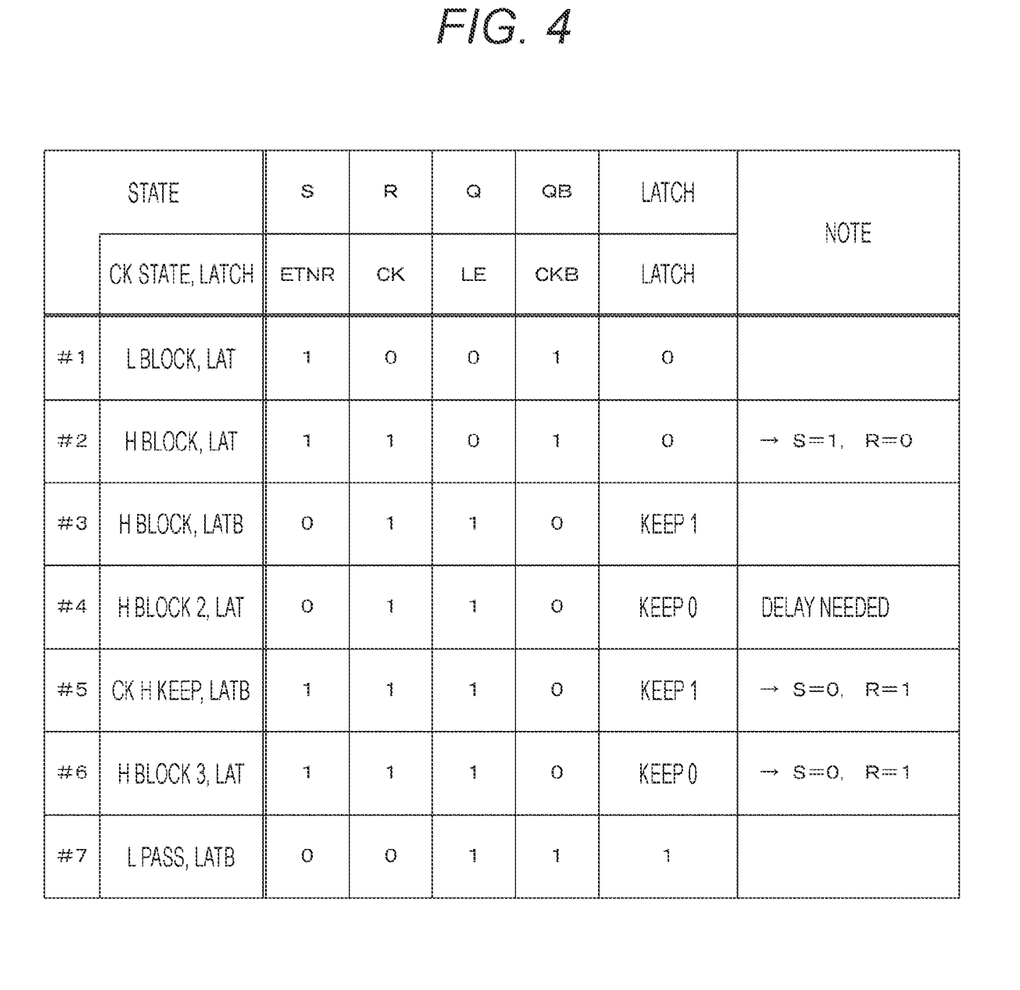
FIG. 4 is a table indicating an example of state transition of the control unit 200 according to the embodiment of the present technology.

FIG. 3 is a diagram illustrating an example of state transition of the control unit 200 according to the embodiment of the present technology. FIG. 4 is a table indicating an example of state transition of the control unit 200 according to the embodiment of the present technology.

Here, the control unit 200 is regarded as an RS latch with one input of the negative AND gate 210 as the reset input R and one input of the negative AND gate 210 as the set input S, and the state transition thereof is analyzed. That is, the clock signal CK is input to the reset input R, and the ETNR is input to the set input S. Then, LE is output from the output Q, and the inverted clock CKB is output from the output QB.

In the initial operation of a standard integrated circuit, the initial value of the clock is the L level, so that the clock signal CK in this state transition diagram also starts from "0".

As a first case, when the enable signal E and the test signal TE are at the L level and the clock enable signal is in a disabled state (ETNR is "1"), the state #1 and the state #2 are repeated. In this case, the inverted clock CKB and LE, which are outputs from the control unit 200, do not change, so that a clock does not toggle in the state holding unit 300. Therefore, power consumption can be suppressed.

As a second case, when at least one of the enable signal E or the test signal TE is at the H level and the clock enable signal is in the enable state (ETNR is "0"), the state #3 and the state #7 are repeated. In this case, the waveform of the inverted clock CKB is inversion of the clock signal CK, and toggling occurs.

As a third case, in a state where the clock signal CK is at the L level, when at least one of the enable signal E or the test signal TE transitions from the L level to the H level, the clock signal CK is propagated as the clock signal CKO. In this case, transition from the state #1 to the state #7 causes the value of the H level to be held in the latch 330. Then, the state transitions between the state #7 and the state #3 due to changes of the clock signal CK, so that the clock signal CK is propagated as the clock signal CKO. At this time, only the inverted clock CKB toggles while both the value held in the latch 330 and LE keep the same value.

As a fourth case, in a state where the clock signal CK is at the L level, when at least one of the enable signal E or the test signal TE transitions from the H level to the L level so that both of the signals become the L level, the clock signal CK is blocked. In this case, the state transitions from the state #7 to the state #1. At this time, the L level is written to the latch 330.

As a fifth case, in a state where the clock signal CKO is at the L level and the clock signal CK is at the H level, when at least one of the enable signal E or the test signal TE transitions from the L level to the H level, the clock signal CK should not be propagated to the clock signal CKO. That is, the clock signal CKO should not transition from the L level to the H level. Specifically, the state transitions from the state #2 to the state #4. At this time, LE first transitions from the L level to the H level, and then the internal clock CKB transitions from the H level to the L level. When the changes are propagated to the latch 330 in this order, the H level is written to the latch 330, so that the clock signal CKO transitions from the L level to the H level. In order not to write the H level to the latch 330 by avoiding this malfunction, it is necessary to insert a delay in the path on the LE side so that the transition of the internal clock CKB from the H level to the L level is propagated to the latch 330 first and then the transition of LE from the L level to the H level is propagated. In this embodiment, the input buffer 320 serves as the delay. For example, by using a transistor of a type having a high threshold voltage as the transistor included in the input buffer 320, it is possible to delay the timing of LE to pass. Therefore, even in the state #4, the L level is held in the latch 330, and the malfunction can be prevented.

As a sixth case, in a state where the clock signal CKO and the clock signal CK are at the H level, when at least one of the enable signal E or the test signal TE transitions from the H level to the L level so that both signals are at the L level and then the clock signal CK transitions to the L level, the clock signal CKO should not transition from the H level to the L level at a time point when both signals change to the L level. Specifically, the state transitions from the state #3 to the state #5. At this time, since neither LE nor the internal clock CKB changes, the latch 330 continues to hold the H level, and the clock signal CKO is not changed to the L level. Thereafter, when the clock signal CK transitions to the L level, the state transitions from the state #5 to the state #1. At this time, the internal clock CKB first transitions from the L level to the H level, and then LE transitions from the H level to the L level. When the transition reaches the latch 330 in this order, the L level is written to the latch 330 correctly.

As a seventh case, attention is paid to a case where in a state where the clock signal CKO is at the L level and the clock signal CK is at the H level, at least one of the enable signal E or the test signal TE transitions from the L level to the H level and transitions again to the L level, and then the clock signal CK transitions to the L level. Specifically, it is a case where the state transitions from the state #4 to the state #6 and further transitions to the state #1. In this case, the output state as the RS latch does not change. When the state transitions from the state #6 to the state #1, the internal clock CKB first transitions from the L level to the H level, and then LE transitions from the H level to the L level. When the transition reaches the latch 330 in this order, the L level is written to the latch 330 correctly.

As an eighth case, attention is paid to a case where in a state where the clock signal CKO and the clock signal CK are at the L level, at least one of the enable signal E or the test signal TE transitions from the L level to the H level and transitions again to the L level. In this case, the state repeatedly transitions between the state #1 and the state #7. At this time, the L level and the H level are correctly written to the latch 330. On the other hand, the internal clock CKB does not transition and stays at the H level not to cause a wasteful toggling, so that power consumption can be suppressed.

Figure 5:
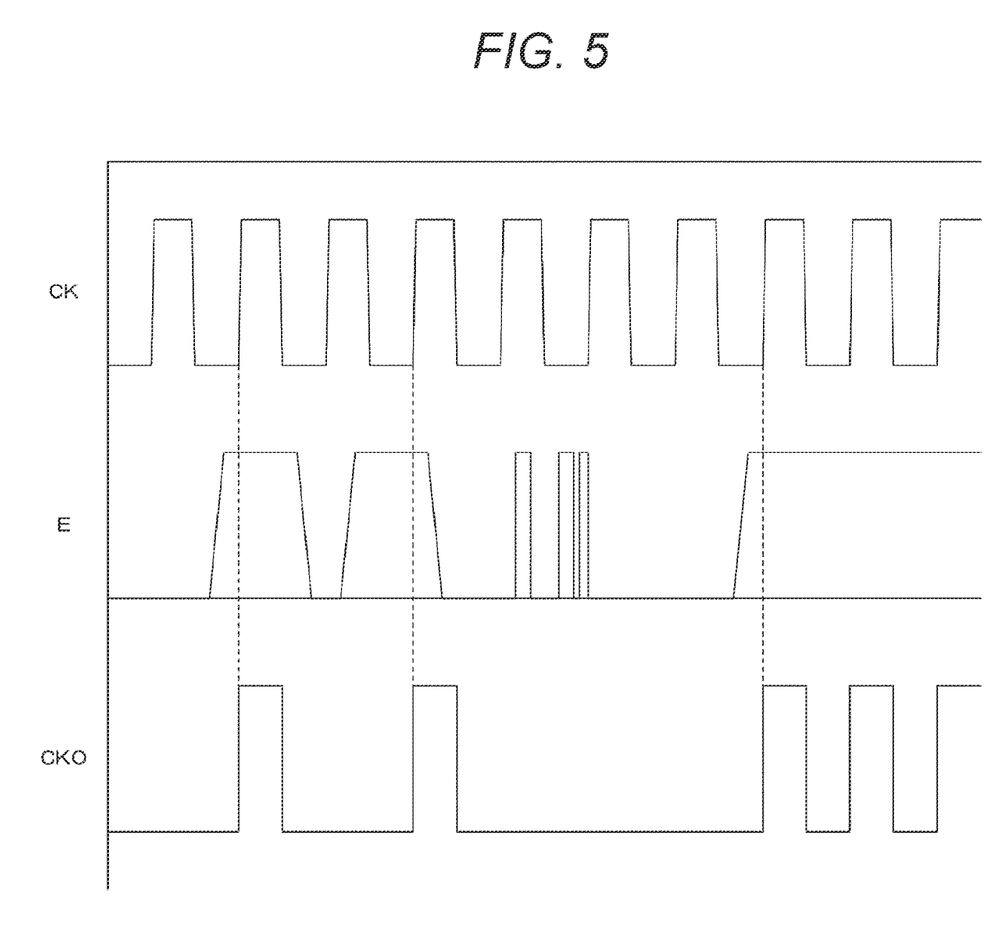
FIG. 5 is a diagram illustrating an example of input and output waveforms of the clock enabler circuit 10 according to the embodiment of the present technology.

FIG. 5 is a diagram illustrating an example of input and output waveforms of the clock enabler circuit 10 according to the embodiment of the present technology.

In this example, a case where the test signal TE is at the L level and the enable signal E changes is assumed. Since the enable signal E transitions between the L level and the H level asynchronously with the clock signal CK, but the clock signal CKO changes in synchronization with the clock signal CK, the enable signal E does not transition in the middle of the L level or the H level. That is, if the enable signal E is at the H level at the rising timing of the clock signal CK, the clock signal CK is propagated as the clock signal CKO, and if the enable signal E is at the L level at the rising timing of the clock signal CK, the clock signal CKO becomes the L level.

As described above, according to the embodiment of the present technology, the state holding unit 300 grasps the state in which the toggling of the internal clock CKB is unnecessary, and appropriately generates LE, whereby unnecessary toggling of the internal clock CKB can be stopped. Furthermore, it is possible to suppress an influence of a change of the enable signal E or the test signal TE when the clock signal CK is at the L level. Therefore, power consumption in the clock enabler circuit 10 can be suppressed.

2. MODIFICATIONS

First Modification

Figure 6:
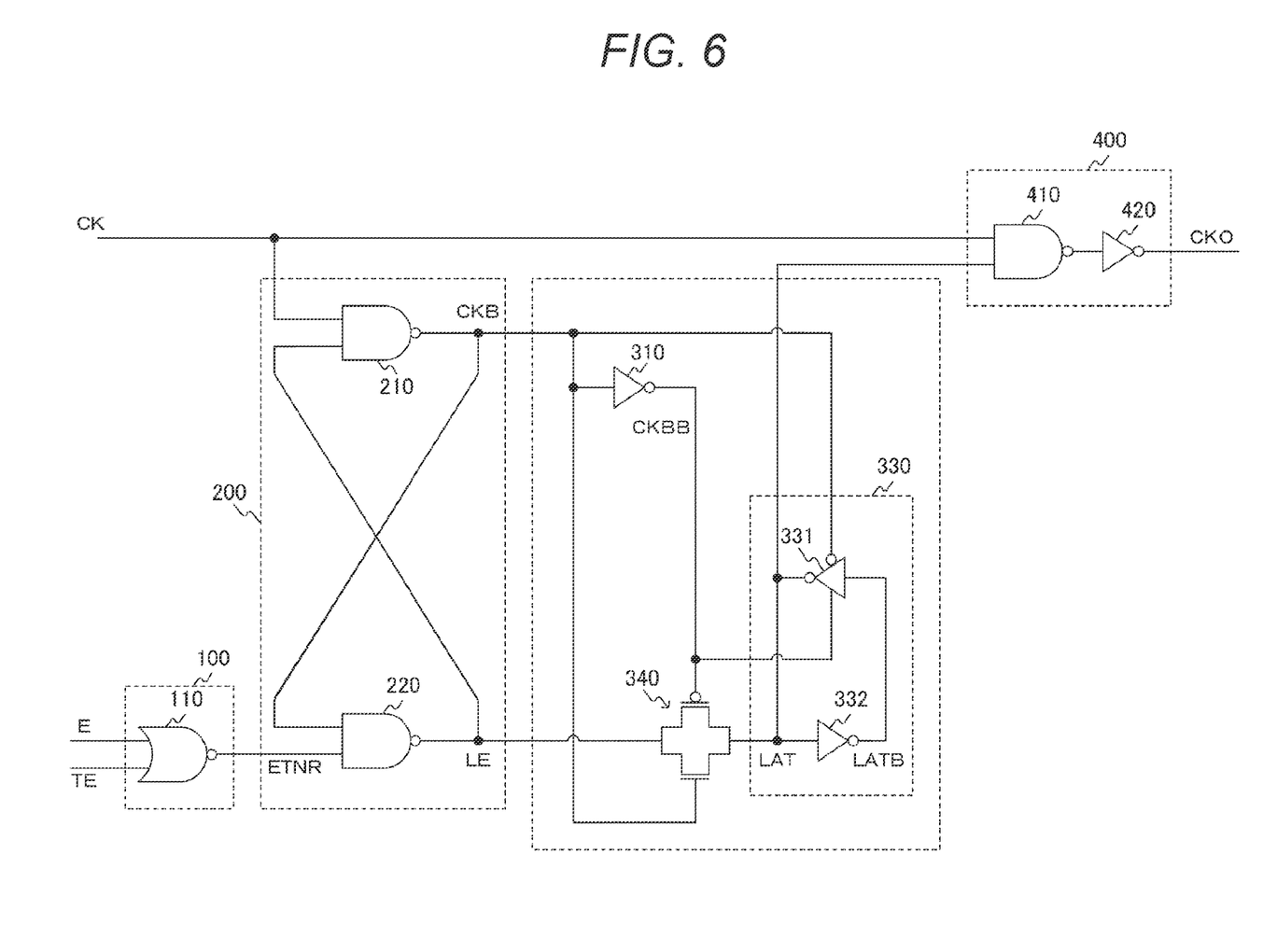
FIG. 6 is a diagram illustrating a first modification of the clock enabler circuit 10 according to the embodiment of the present technology.

FIG. 6 is a diagram illustrating a first modification of the clock enabler circuit 10 according to the embodiment of the present technology.

In the first modification, a transmission gate 340 is provided instead of the input buffer 320 in the above-described embodiment. The transmission gate 340 is controlled by the internal clock CKB and an inverted clock CKBB of the internal clock CKB to cause the input LE to pass to the latch 330.

In the above-described embodiment, the timing of transition of the state from the state #2 to the state #4 is adjusted by adjusting the delay amount of the input buffer 320. In the first modification, a similar effect can be obtained and the number of transistors can be reduced as well by controlling the timing at which the LE passes through the transmission gate 340. For example, by using a transistor of a type having a high threshold voltage as the transistor included in the transmission gate 340, it is possible to delay the timing of LE to pass.

Second Modification

Figure 7:
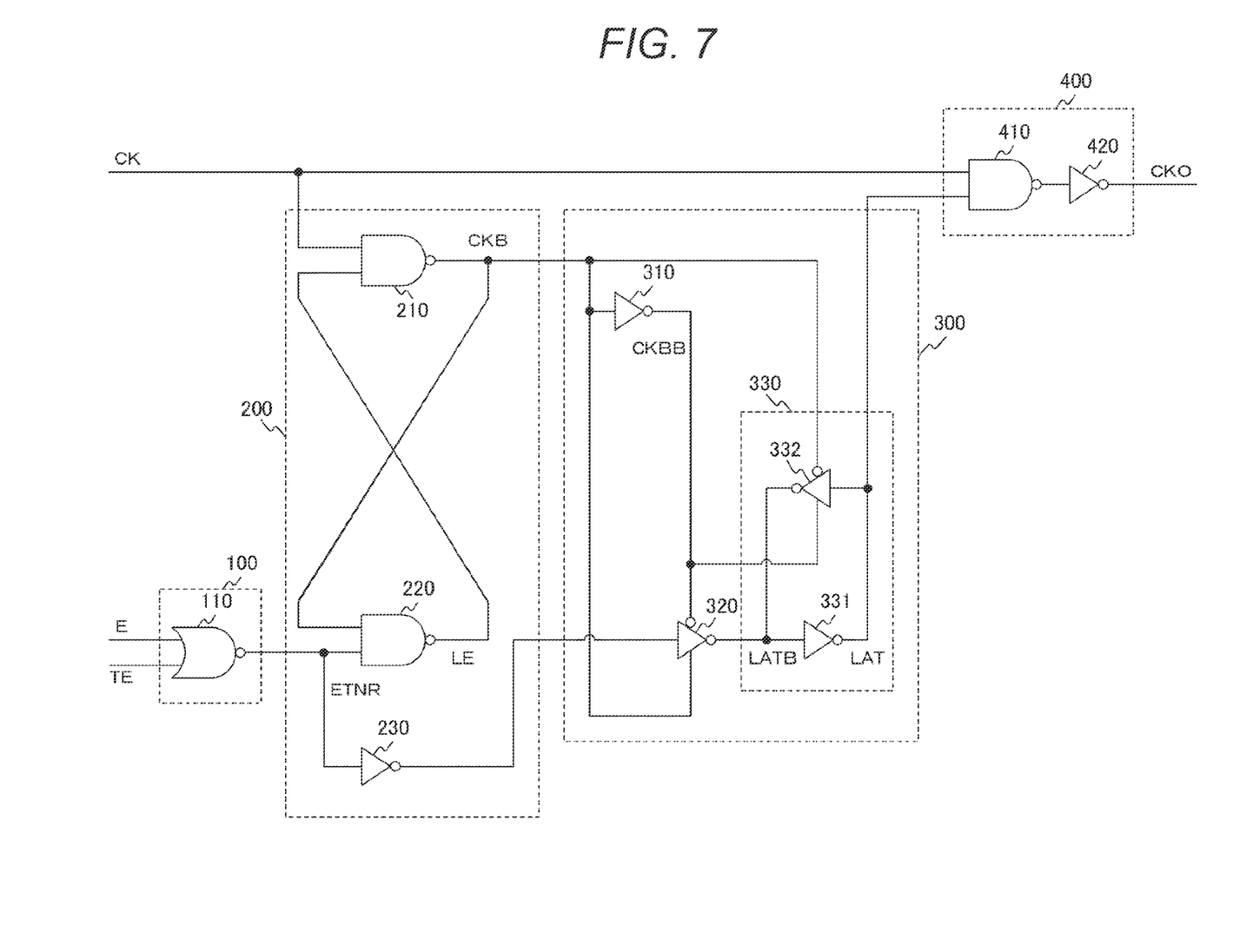
FIG. 7 is a diagram illustrating a second modification of the clock enabler circuit 10 according to the embodiment of the present technology.

FIG. 7 is a diagram illustrating a second modification of the clock enabler circuit 10 according to the embodiment of the present technology.

In the second modification, not LE but the output of an inverter 230 is connected as the input of the input buffer 320.

The inverter 230 generates an inverted signal of the output ETNR of the negative OR gate 110.

Third Modification

Figure 8:
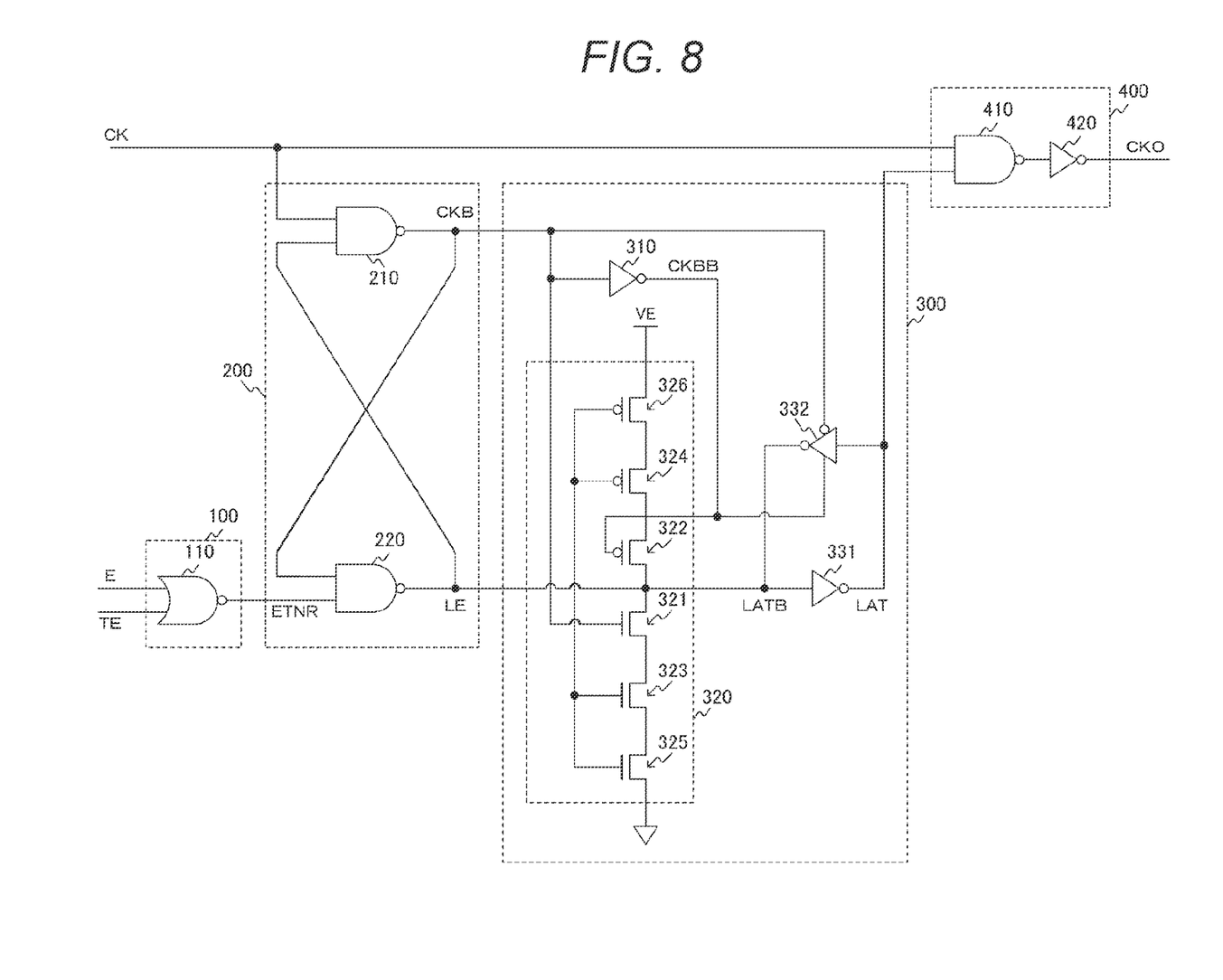
FIG. 8 is a diagram illustrating a third modification of the clock enabler circuit 10 according to the embodiment of the present technology.

FIG. 8 is a diagram illustrating a third modification of the clock enabler circuit 10 according to the embodiment of the present technology.

In the third modification, an example of a case where the number of vertical stack stages of the transistors 321 to 326 is changed in order to adjust the delay amount of the input buffer 320 is provided. The internal clock CKB is connected to the gate of the transistor 321, and the inverted clock CKBB is connected to the gate of the transistor 322. Therefore, the input buffer 320 has a function as an inverter. By vertically stacking the transistors 323 and 324 and further the transistors 325 and 326 on the outer sides of the transistors 321 and 322, the delay amount of the input buffer 320 can be increased.

Fourth Modification

Figure 9:
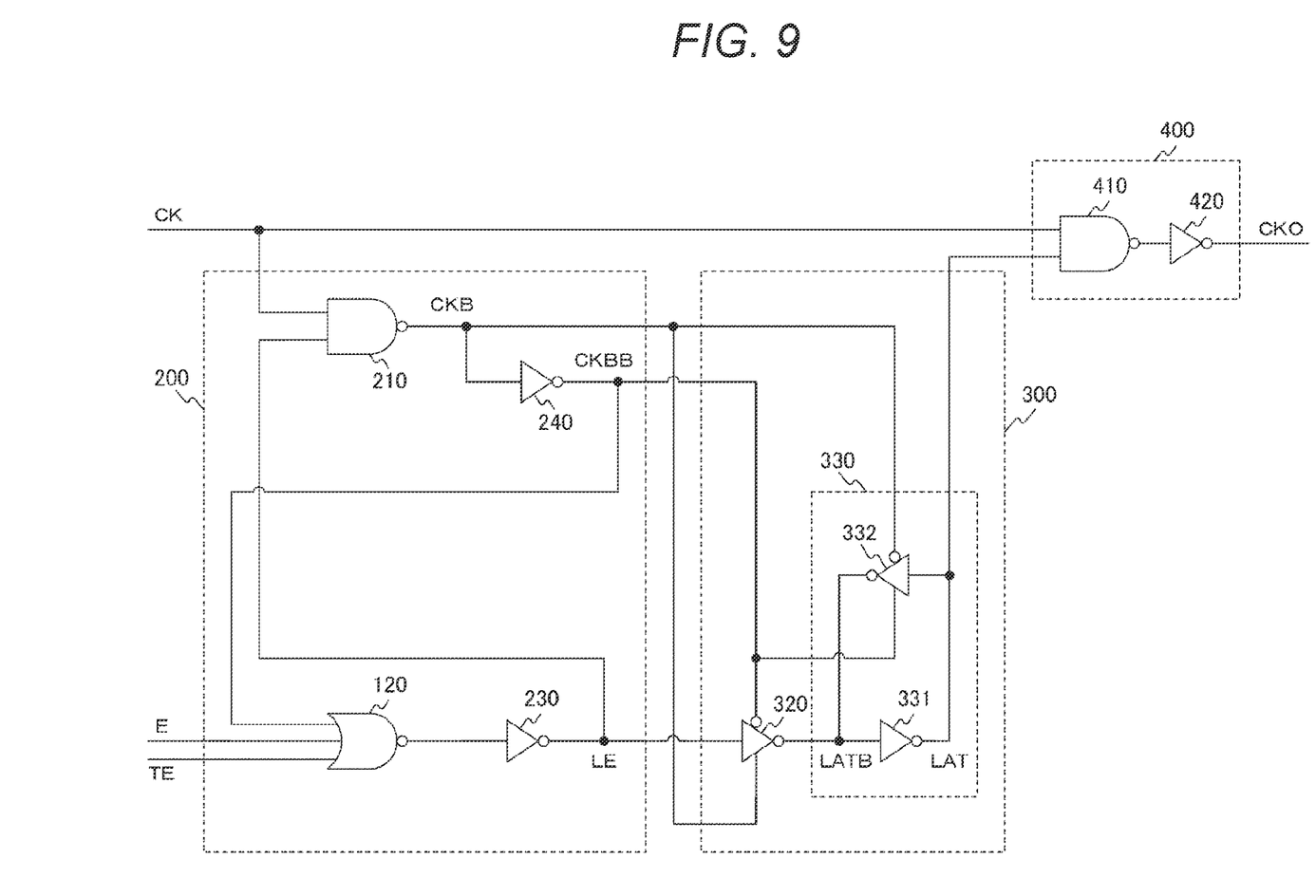
FIG. 9 is a diagram illustrating a fourth modification of the clock enabler circuit 10 according to the embodiment of the present technology.

FIG. 9 is a diagram illustrating a fourth modification of the clock enabler circuit 10 according to the embodiment of the present technology.

In the fourth modification, the function of the clock enable signal generation unit 100 in the above-described embodiment is incorporated into the control unit 200. Accordingly, the configuration as the RS latch circuit is realized by a circuit configuration different from the two negative AND gates. That is, a 3-input negative OR gate 120 is provided, and the clock CKBB is input in addition to the enable signal E and the test signal TE. Therefore, the inverted clock generation unit 310 in the above-described embodiment is included in the control unit 200 as an inverted clock generation unit 240. Furthermore, the inverter 230 is provided to generate LE from the output of the negative OR gate 120.

The fourth modification is equivalent in logic to the above-described embodiment. As described above, modifications in which logic is appropriately modified in consideration of the layout in the integrated circuit may be adopted.

Fifth Modification

Figure 10:
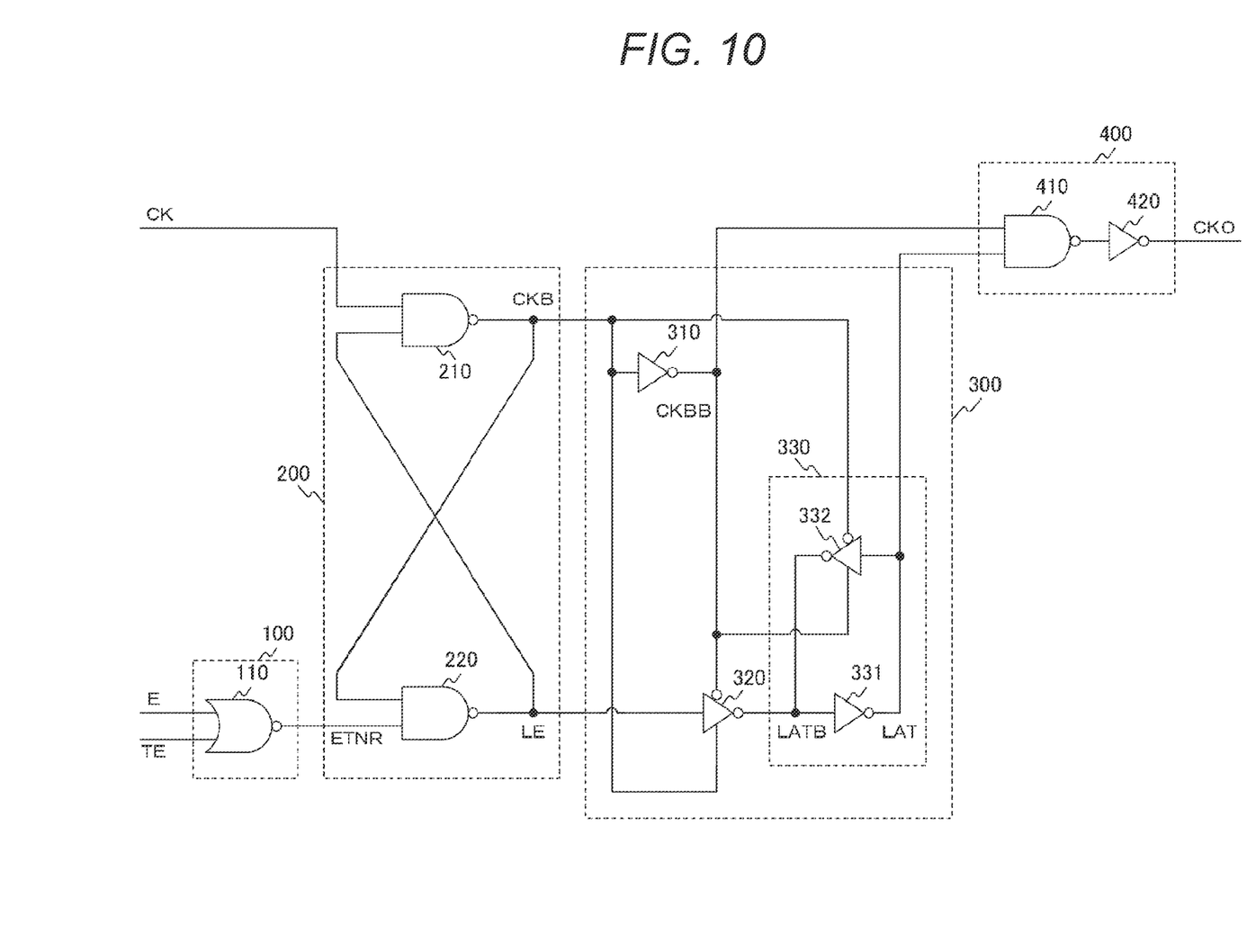
FIG. 10 is a diagram illustrating a fifth modification of the clock enabler circuit 10 according to the embodiment of the present technology.

FIG. 10 is a diagram illustrating a fifth modification of the clock enabler circuit 10 according to the embodiment of the present technology.

In the fifth modification, as the clock signal input to the negative AND gate 410 of the clock signal output unit 400, the clock signal CK is not directly input as in the above-described embodiment, but the clock CKBB internally generated is input. Also in this case, the logic of the clock signal CKO does not change.

By separating the clock signal CK from the clock signal output unit 400 in this manner, the fan-out number of the clock signal CK can be reduced to half, and the load capacitance of the clock signal CK can be reduced. Furthermore, by increasing the number of parts where the operation can be stopped when the clock enable signal is in the disabled state, the power consumption due to the toggling of the clock can be reduced.

Sixth Modification

Figure 11:
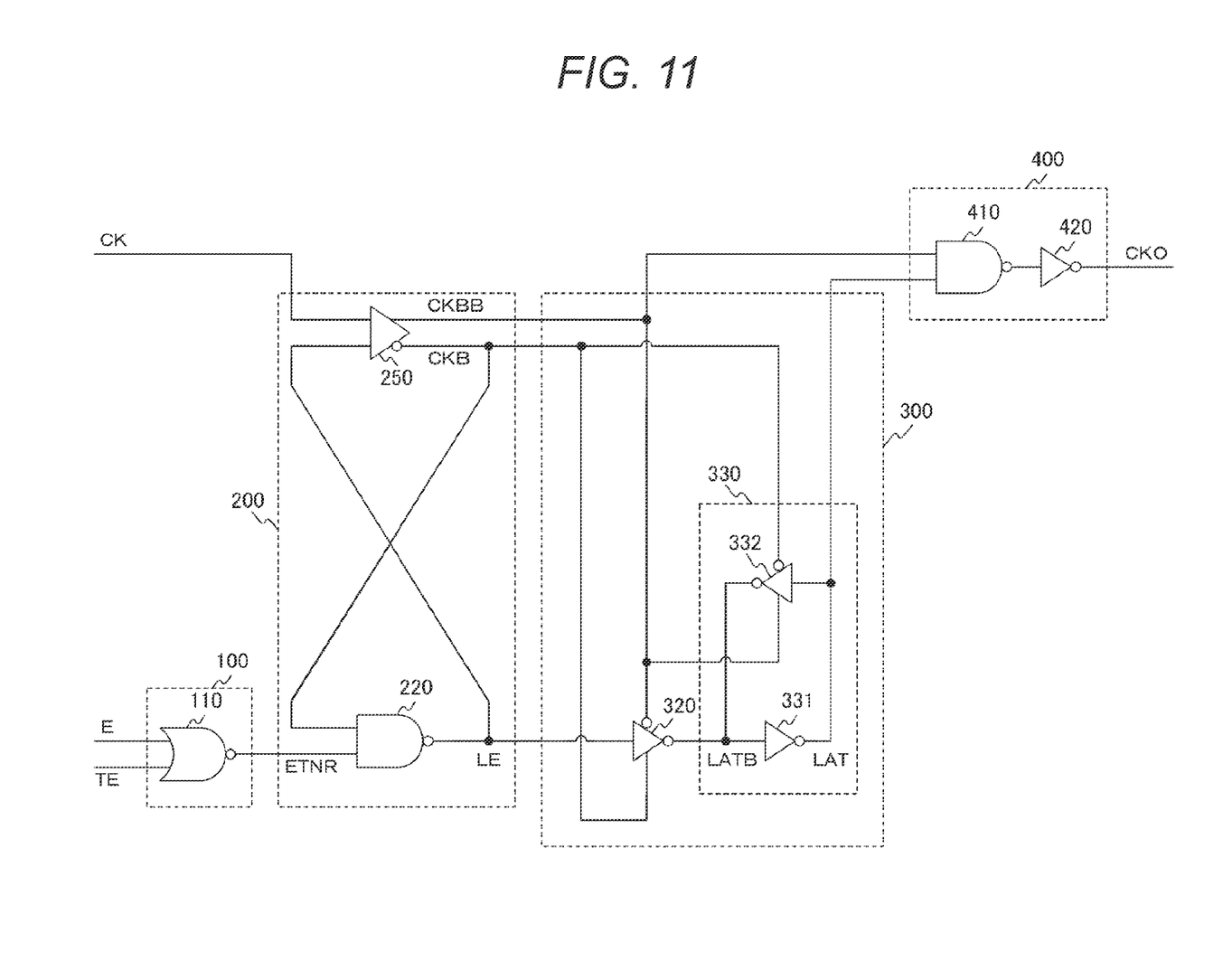
FIG. 11 is a diagram illustrating a sixth modification of the clock enabler circuit 10 according to the embodiment of the present technology.

FIG. 11 is a diagram illustrating a sixth modification of the clock enabler circuit 10 according to the embodiment of the present technology.

In the sixth modification, a reception circuit 250 is provided instead of the negative AND gate 210 in the above-described embodiment. The reception circuit 250 generates an AND CKBB of the clock signal CK and LE, and generates a negative AND CKB. That is, the logic is equivalent to that of the negative AND gate 210 in the above-described embodiment in that the negative AND CKB is generated. Furthermore, the logic is equivalent to that of the negative AND 210 when considered to include the inverted clock generation unit 310 in the above-described embodiment in that the CKBB is generated.

Furthermore, in the sixth modification, similarly to the above-described fifth modification, the clock CKBB generated internally is input to the clock signal output unit 400. Therefore, the clock signal CK can be separated from the clock signal output unit 400, and the load capacitance of the clock signal CK can be reduced.

The reception circuit 250 may implement a level shift circuit that shifts a level from a small amplitude (small swing) to a normal amplitude (full swing). At this time, the level shift circuit is configured to operate only when LE is at the H level and not to operate when LE is at the L level. Therefore, the level shift circuit, which normally causes an operation cost, can be configured as a circuit that is stopped when the enable signal E or the test signal TE is in a disabled state and that does not consume wasteful power.

Figure 12:
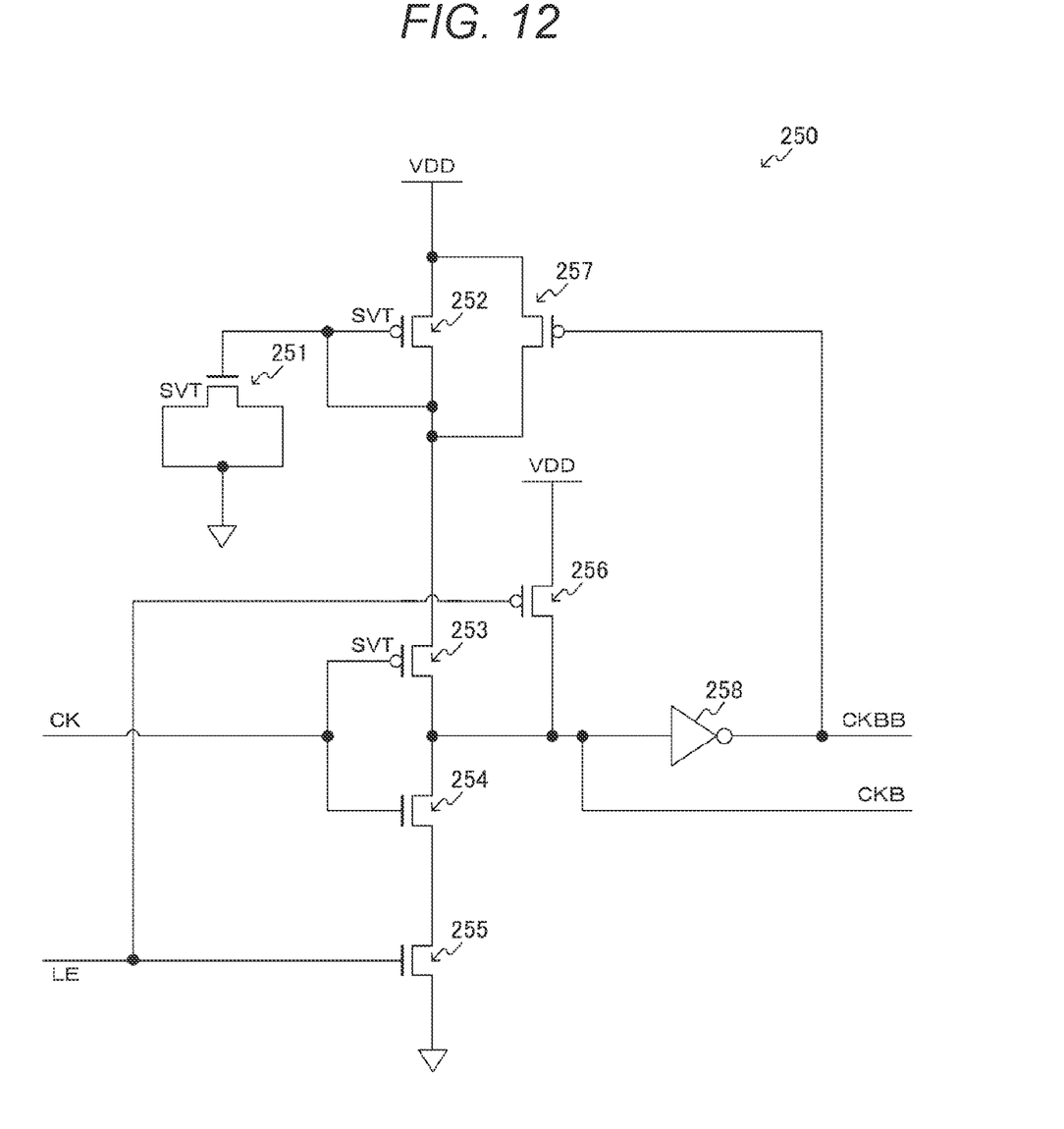
FIG. 12 is a diagram illustrating an example of a reception circuit 250 in the sixth modification of the clock enabler circuit 10 according to the embodiment of the present technology.

FIG. 12 is a diagram illustrating an example of the reception circuit 250 in the sixth modification of the clock enabler circuit 10 according to the embodiment of the present technology.

The reception circuit 250 in the figure is an example in a case where a level shift circuit is implemented. The reception circuit 250 includes transistors 251 to 257 and an inverter 258. Among them, the transistors 251 to 253 are standard threshold voltage transistors (SVT), and the transistors 254 to 257 are low threshold voltage transistors (LVT). Therefore, the threshold on the H level side of the clock signal CK can be lowered to correspond to small-amplitude signals.

In the example of the reception circuit 250, an example of a case where the clock signal CK is a small-amplitude signal has been described. However, in addition to this, for example, a case where another low power technology is implemented such as a case where the clock signal CK is a differential small-amplitude signal can be similarly handled by the reception circuit 250. That is, the reception circuit 250 collectively receives the clock signal CK and then distributes the clock signals CK in the circuit, so that processing such as level conversion can be performed in one place.

Note that the above-described embodiment is provided as an example for embodying the present technology, and the matters in the embodiment and the matters specifying the invention in the claims have a correspondence relationship. Similarly, the matters specifying the invention in the claims and the matters in the embodiment of the present technology denoted by the same names as the matters specifying the invention have a correspondence relationship. However, the present technology is not limited to the embodiment, and can be embodied by making various modifications to the embodiment without departing from the gist thereof.

Note that the effects described in the present specification are merely examples and effects are not limited thereto, and other effects may be provided.

Note that the present technology may have the following configurations.

(1) A clock enabler circuit comprising:
a state holding unit that performs a holding operation of a state as to whether or not to output an output clock signal according to an internal clock signal;
a clock signal output unit that controls output of the output clock signal according to the state held in the state holding unit; and
a control unit that supplies, to the state holding unit, the internal clock signal and a value of the state that are necessary for the holding operation on the basis of a clock signal and a clock enable signal from the outside.

(2) The clock enabler circuit according to the above-described (1), in which the control unit operates the internal clock signal when the clock enable signal indicates an enable state, and stops the internal clock signal when the clock enable signal does not indicate an enable state.

(3) The clock enabler circuit according to the above-described (1) or (2), in which the control unit supplies a state to output the output clock signal as the value of the state in a case where the clock enable signal indicates an enable state, and supplies a state not to output the output clock signal as the value of the state in a case where the clock enable signal does not indicate an enable state.

(4) The clock enabler circuit according to any one of the above-described (1) to (3), in which the state holding unit includes a delay unit that delays a timing when the value of the state is held.

(5) The clock enabler circuit according to the above-described (4), in which the delay unit is a clocked inverter that operates according to the internal clock signal.

(6) The clock enabler circuit according to the above-described (4), in which the delay unit is a transmission gate that operates according to the internal clock signal.

(7) The clock enabler circuit according to any one of the above-described (1) to (6), in which the clock signal output unit generates the output clock signal on the basis of the clock signal from the outside.

(8) The clock enabler circuit according to any one of the above-described (1) to (6), in which the clock signal output unit generates the output clock signal on the basis of the internal clock signal.

(9) The clock enabler circuit according to any one of the above-described (1) to (8), in which the control unit includes a reception circuit that receives the clock signal from the outside.

(10) The clock enabler circuit according to the above-described (9), in which the reception circuit is a small-amplitude signal reception circuit.

(11) The clock enabler circuit according to the above-described (9), in which the reception circuit is a differential small-amplitude signal reception circuit.

REFERENCE SIGNS LIST

10 Clock enabler circuit
20 Flip-flop circuit
30 Combination circuit
100 Clock enable signal generation unit
110, 120 Negative OR (NOR) gate
200 Control unit
210, 220 Negative AND (NAND) gate
230 Inverter
240 Inverted clock generating unit
250 Reception circuit
251 to 257 Transistor 258 Inverter
300 State holding unit
310 Inverted clock generating unit
320 Input buffer
321 to 326 Transistor
330 Latch
331 Inverter
332 Clocked inverter
340 Transmission gate
400 Clock signal output unit
410 Negative AND (NAND) gate
420 Inverter

The invention claimed is:

1. A clock enabler circuit, comprising:
a state holding unit configured to perform, based on an internal clock signal, a holding operation of a state, wherein the state indicates whether to output an output clock signal;
a clock signal output unit configured to control the output of the output clock signal based on the state held in the state holding unit; and
a control unit configured to:
  receive a clock signal and a clock enable signal from an outside of the control unit; and
  supply, to the state holding unit, the internal clock signal and a value of the state that are for the holding operation, wherein
    the supply is based on the clock signal and the clock enable signal, and
    the state holding unit includes a delay unit configured to delay a timing at which the value of the state is supplied to the state holding unit.

2. The clock enabler circuit according to claim 1, wherein the control unit is further configured to:
supply the internal clock signal in a case where the clock enable signal indicates an enable state; and
stop the supply of the internal clock signal in a case where the clock enable signal indicates a disabled state.

3. The clock enabler circuit according to claim 1, wherein the control unit is further configured to:
supply, in a case where the clock enable signal indicates an enable state, a first value of the state to output the output clock signal; and
supply, in a case where the clock enable signal does not indicates a disabled state, a second value of the state to stop the output of the output clock signal.

4. The clock enabler circuit according to claim 1, wherein the delay unit includes a clocked inverter configured to be operated based on the internal clock signal.

5. The clock enabler circuit according to claim 1, wherein the delay unit includes a transmission gate configured to be operated based on the internal clock signal.

6. The clock enabler circuit according to claim 1, wherein the clock signal output unit is further configured to generate the output clock signal based on the clock signal from the outside.

7. The clock enabler circuit according to claim 1, wherein the clock signal output unit is further configured to generate the output clock signal based on the internal clock signal.

8. The clock enabler circuit according to claim 1, wherein the control unit includes a reception circuit configured to receive the clock signal from the outside.

9. The clock enabler circuit according to claim 8, wherein the reception circuit is a small-amplitude signal reception circuit.

10. The clock enabler circuit according to claim 8, wherein the reception circuit is a differential small-amplitude signal reception circuit.

* * * * *